United States Patent [19]

Liu et al.

[11] Patent Number: 4,734,752
[45] Date of Patent: Mar. 29, 1988

[54] ELECTROSTATIC DISCHARGE PROTECTION DEVICE FOR CMOS INTEGRATED CIRCUIT OUTPUTS

[75] Inventors: Yow-Juang B. Liu, San Jose; Salvatore Cagnina, Los Altos, both of Calif.

[73] Assignee: Advanced Micro Devices, Inc., Sunnyvale, Calif.

[21] Appl. No.: 781,287

[22] Filed: Sep. 27, 1985

[51] Int. Cl.$^4$ ............................................. H01L 29/78
[52] U.S. Cl. .................................. 357/23.4; 357/23.1; 357/23.12; 357/23.13; 357/42; 357/13; 307/304
[58] Field of Search .................... 357/23.1, 23.8, 23.12, 357/23.13, 42, 13; 307/304

[56] References Cited

U.S. PATENT DOCUMENTS 4,342,045  7/1982  Kim ............................. 357/23.13 X

FOREIGN PATENT DOCUMENTS 2045525  10/1980  United Kingdom ............... 357/23.8

Primary Examiner—Martin H. Edlow
Attorney, Agent, or Firm—Patrick T. King; Eugene H. Valet; Warren S. Wolfeld

[57] ABSTRACT

An integrated circuit device for protecting the circuitry of an integrated circuit from an electrostatic discharge into an output pin of the chip is disclosed. In a preferred embodiment, the device comprises an n-well, n-channel, polysilicon-gated FET structure, which operates in a punch-through mode, coupled to an output pad and an output buffer of the circuit. Back biasing in the chip system affords additional inhibition to turn-on during normal system operation.

12 Claims, 6 Drawing Figures

ELECTROSTATIC DISCHARGE PROTECTION DEVICE FOR CMOS INTEGRATED CIRCUIT OUTPUTS

BACKGROUND OF THE INVENTION

1. Field of the Invention

The present invention generally relates to integrated circuit protection devices and, in particular, to a device for protecting an integrated circuit from damage which can be caused by an electrostatic discharge into an output terminal.

2. Description of the Related Art

One chronic problem associated with semiconductor integrated circuits is the damage which can be caused to the circuitry by an electrostatic discharge (ESD) into any one of the external connector pins. In handling a semiconductor chip, a simple static electricity discharge from a finger tip can achieve an instantaneous level of thousands of volts. It is commonly known that a much smaller static voltage discharge into the die interior can result in destruction due to junction breakdown, contact breakdown, thermal burnout and, in circuits using gated components, breakdown of the gate oxide layers.

ESD protection has become a topic of increasing interest as the device dimensions within a chip decrease and, therefore, make the products more susceptible to the harmful effects of an ESD event.

In general, ESD protection devices can be separated into two categories: input and output protection designs. Because of different operational requirements, different schemes are needed for each. Normally, a chip output cannot tolerate a high resistance factor. This becomes even more serious if the voltage range of the output increases.

The typical ESD protection scheme relies on either output junction breakdown or gated diode breakdown of the output transistors. FIG. 1 shows an example of a typical arrangement used for ESD protection of an integrated circuit. The layer of the output buffer transistors may be optimized to afford some protection. If the output transistors N1, N2 are laid out with a proper spacing between the contacts and gates, then the failure mechanism is dominated by output junction breakdowns [designated by the encircled areas in FIG. 1(b)]. The ESD voltage of this failure mode is slightly higher than that for a gated diode breakdown arrangement. An example of such a device is shown in U.S. Pat. No. 4,139,935 to Bertin et al. In comparison to this example, the present disclosure teaches an invention which is independent from the buffer stage.

In general, the state-of-the-art ESD protection devices achieve the ability to dissipate approximately 2000 volts into a connection pin. However, destructive junction breakdown has been found to occur in shallow junction CMOS circuits at much lower ESD voltages. Hence, there is a need for devices which will provide greater ESD protection for integrated circuits.

SUMMARY OF THE INVENTION

It is an object of the present invention to protect the circuitry of a semiconductor chip from damage which can be caused by an ESD into any of its external connection pins.

It is another object of the present invention to provide a semiconductor device which improves the tolerance of the output of an integrated circuit to an ESD input to any of its external connection pins.

It is a further object of the present invention to provide an ESD protection device structure which is amenable to various integrated circuit fabrication designs and processes.

It is yet a further object of the present invention to provide an ESD protection device structure which is suitable for incorporation into a variety of CMOS integrated circuits.

In its broad aspect, the present invention is a field effect transistor (FET) device which is structured so as to allow punch-through turn-on during an ESD occurrence but which will inhibit turn-on during normal circuit output operating conditions. If the integrated circuit operates with a back bias voltage, the turn-on voltage during normal circuit operation will be even higher so as not to affect circuit performance. The preferred embodiment disclosed is an n-well, n-channel, polysilicon-gated structure having the gate and an n+ doped drain coupled between an output contact of the pad of the integrated circuit and an n+ doped source coupled to the circuit ground reference potential level, $V_{ss}$.

Other objects, features and advantages of the present invention will become apparent upon consideration of the following detailed description and the accompanying drawings, in which like reference designations represent like features throughout the FIGURES.

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

It should be recognized that many publications describe the details of common techniques used in the fabrication process of integrated circuit components. See, e.g., *Semiconductor & Integrated Circuit Fabrication Techniques*, Reston Publishing Co., Inc., copyright 1979 by the Fairchild Corporation. Those techniques can be generally employed in the fabrication of the structure of the present invention. Moreover, the individual steps of such a process can be performed using commercially available integrated circuit fabrication machines. As specifically necessary to an understanding of the present invention, approximate technical data for the preferred embodiment is set forth based upon current technology. Future developments in this art may call for appropriate adjustments as would be obvious to one skilled in the art.

Figure 1A:
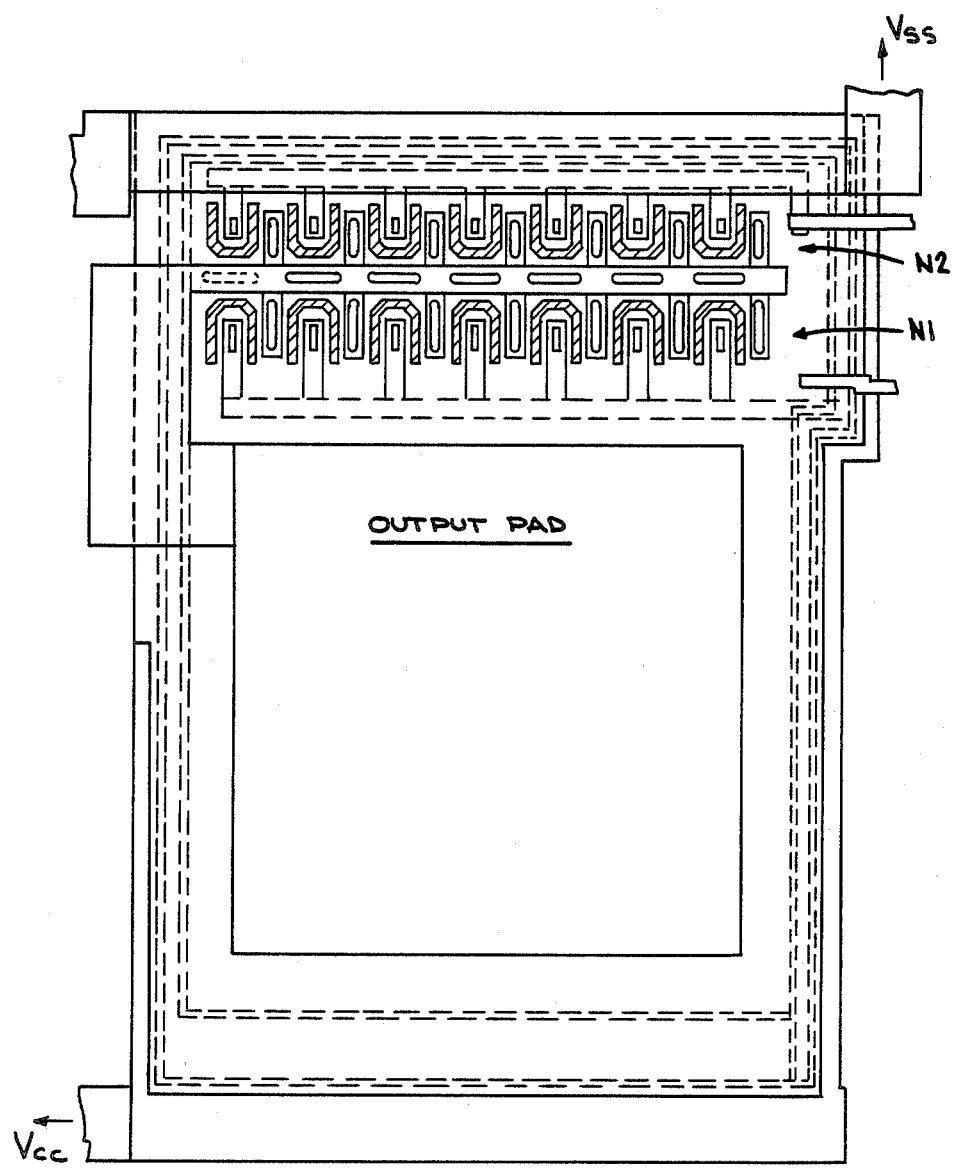
FIG. 1(a) is a layout drawing for an output buffer transistor arrangement in the prior art.
Figure 1B:
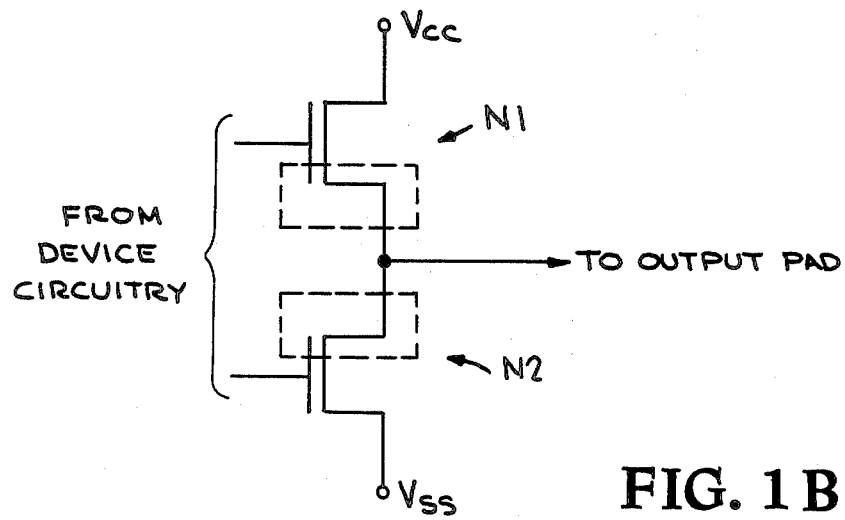
FIG. 1(b) is an electrical schematic drawing for the prior art as shown in FIG. 1(a).
Figure 2:
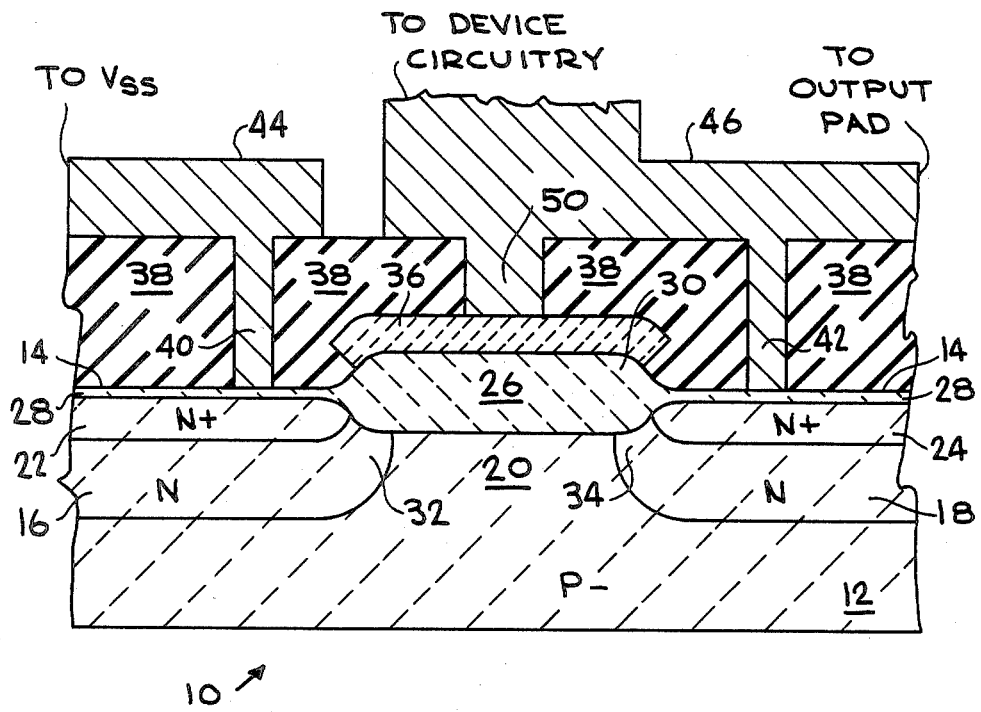
FIG. 2 is a schematic cross-sectional view of the preferred embodiment ESD protection device structure according to the present invention.

Referring now to FIG. 2, the ESD protection device is designated by reference numeral 10. A substrate 12, such as a crystalline silicon substrate or an epitaxial crystalline silicon layer on a substrate, is lightly doped to provide a semiconductor substrate 12. The substrate is made to have a first conductivity type, in this embodiment p—, such as, for example, by doping the substrate with boron ions to a concentration of approximately $10^{14}$ to $10^{15}$ per $cm^3$.

Into the surface 14 of the substrate 12, there is embedded a first well region 16 and a second well region 18 of a second conductivity type, n. The wells can be formed, for example, by masking and diffusion techniques or ion implantation techniques. For example, phosphorous ions can be implanted to a concentration of approximately $10^{16}$ per $cm^3$ to form a junction with the substrate at a depth of approximately 2 to 5 microns below the substrate surface 14.

The region 20 of the substrate 12 between the wells 16, 18 defines a channel region 20. The channel length, that is, the n-well to n-well spacing, can be chosen to optimize the performance of the structure. More detail in this regard is provided hereinafter.

A first terminal region 22, defining a source region 22 in the preferred embodiment, is embedded within the first well region 16. For example, masking and diffusion techniques or ion implantation techniques can be performed in order to create a source region 22 in the first well region 16 at the substrate surface 14.

In the preferred embodiment, the source region 22 is doped with arsenic ions in order to give the region 22 the same conductivity type as the first well region 16 in which it is embedded, but with a higher concentration of carriers. This is referred to, therfore, as an n+ doped source region 22, having a doping concentration of approximately $1 \times 10^{19}$ to $1 \times 10^{21}$ per $cm^3$.

The dimensions of the source region in the preferred embodiment are approximately $10 \times 100$ microns (width $\times$ length). The junction depth is approximately 0.3-0.4 micron into the first well region 16.

Similarly, a second terminal region 24, defining a drain region 24 in the preferred embodiment, is embedded within the second well region 18. The same fabrication parameters as the source region 22 implant apply.

Superposing the source 22, drain 24 and channel 20 regions, an insulator layer 26 is formed. In the preferred embodiment, a thermal oxide layer 26 is fabricated using standard diffusion procedures. An oxide layer 26 having a thin oxide layer 28 is formed over the source region 22 and drain region 24. A thick region 30, referred to as the field oxide 30, is formed over the channel region 20 and an adjacent portion 32 of the first well region 16 and adjacent portion 34 of the second well region 18. The field oxide 30 has a thickness of approximately 1 micron or less. The thin layer regions 28 have a thickness of approximately 200-500 Angstroms.

A polysilicon gate 36 superposes the field oxide 30 and the adjacent n-well regions 32, 34. The thickness of the gate 36 is approximately 0.5 micron.

Insulator layers 38, for example as may be formed using commonly known chemical vapor deposition, provide the necessry component insulation.

Contact windows 40, 42 in the insulator layer regions 38 are provided, such as by masking and etching, in order to provide interconnection via metal layers 44, 46 to the first and second terminal regions 22, 24, respectively.

Similarly, a contact window 50 is provided in the insulator layer 38 over the gate 36 in order to provide interconnection via a subsequently deposited metal layer 46.

So constructed, the ESD protection device 10 may be referred to as an n-well, n-channel, punch-through transistor which operates in the following manner as will be best understood with reference to FIGS. 3(a) and 3(b).

Two MOSFETS Q1, Q2 are coupled to form an output buffer 2 for an integrated circuit (not shown). Each of the MOSFETs Q1, Q2 are n-channel devices in the illustrated exemplary ESD protection circuit 4 as shown in FIG. 3(b). Gate input terminals of each MOSFET Q1, Q2 are coupled to receive an output signal of the chip circuitry. The drain of one MOSFET Q1 is coupled to the chip biasing reference potential, Vcc, of the chip. The source of that MOSFET Q1 is coupled to the output pad of the chip and to the drain of the other MOSFET Q2, which is similarly coupled to the output pad. The source of the second MOSFET Q2 is coupled to the ground reference potential, Vss, of the chip.

Figure 3A:
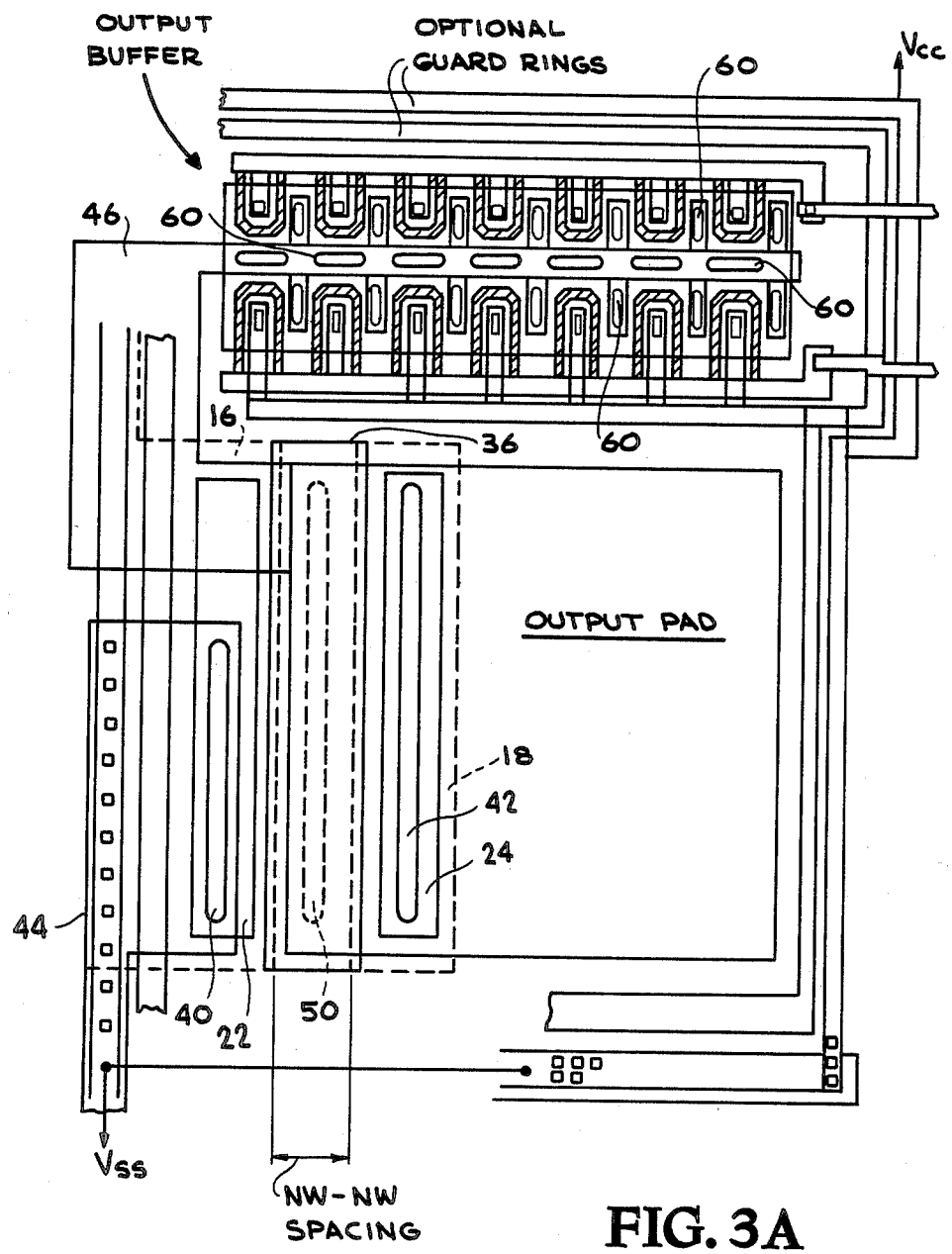
FIG. 3(a) is a layout drawing for an ESD protection device according to the present invention, implementing the structure as shown in FIG. 2.
Figure 3B:
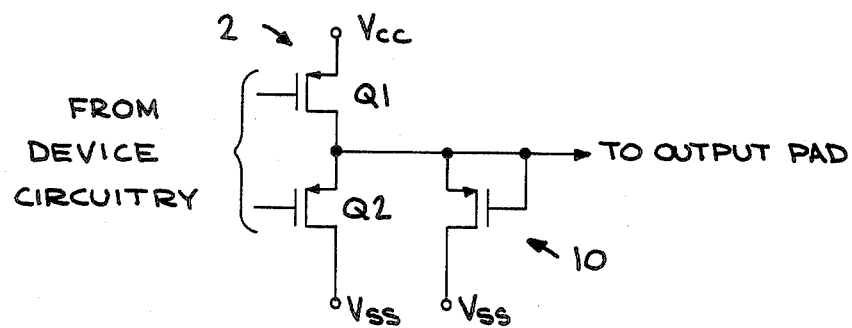
FIG. 3(b) is an electrical schematic drawing according to the present invention as shown in FIG. 3(a).

The ESD protection device 10 is coupled between the output buffer and the output pad as demonstrated in FIG. 3(a). The gate 36 and drain 24 are coupled to the output pad. The source 22 is coupled to Vss. In an alternative embodiment, the pad contacts to both Q1 and Q2 are implanted with phosphorous ions to form deep n-well junctions on the drain side underneath the contacts 60. This further protects the output buffer transistors Q1, Q2 from shallow junction breakdown during an ESD event. All contacts are n+ doped regions. The doping of these contacts and contact well regions is approximately the same as that for the first and second wells.

The ESD protection device 10 operates on the "punch-through" principle. If the spacing between the drain and source regions of a MOSFET is sufficiently small and the resistivity of the substrate is sufficiently high, the depletion region associated with a reverse biased drain-substrate junction can spread with increasing drain voltage. Eventually this depletion region will touch the depletion region associated with the source-substrate junction. For increasingly positive applied drain voltage beyond punch-through, majority carriers in the source region are injected into the depleted channel region and are swept by the high transverse electric field in the channel to the drain.

ESD protection device 10 can be designed in accordance with current fabrication process technology such that turn-on voltage of this device 10 is in the punch-through mode and is much lower than the gated diode breakdown voltage or junction breakdown voltage of the output buffer MOSFET Q1, Q2. On this design criteria, sufficient dumping of an ESD into the output pad will occur before such an ESD can cause any permanent damage to the output buffer 2 or the internal circuitry of the chip.

Figure 4:
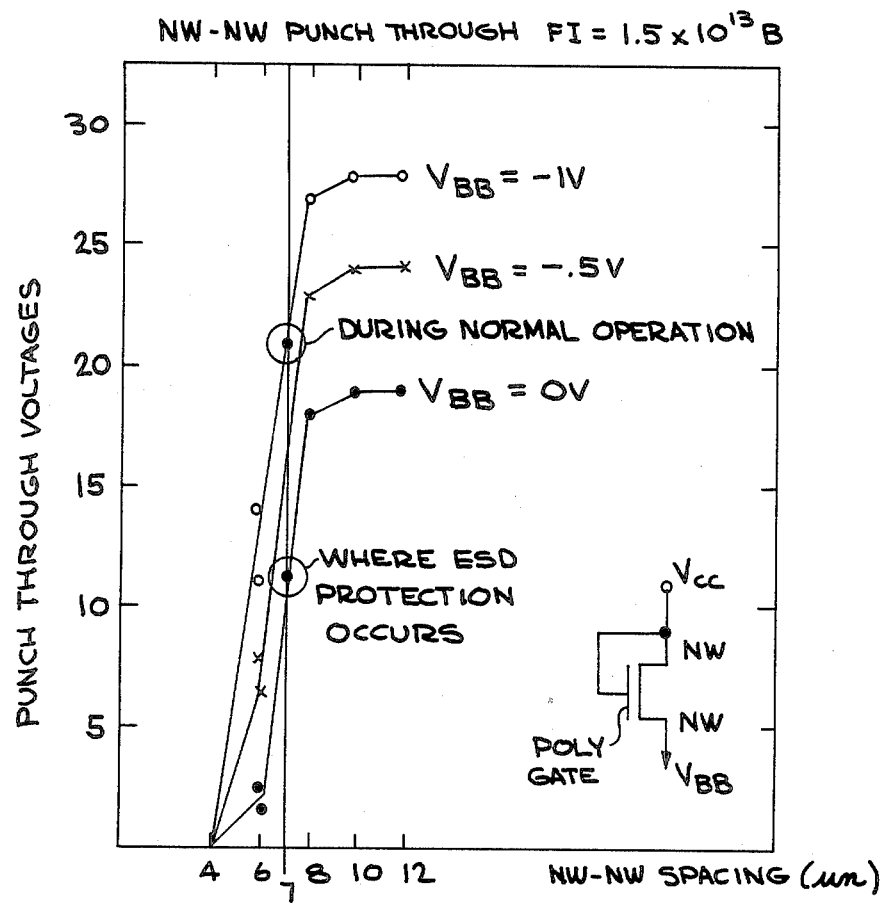
FIG. 4 is a graphical representation showing a plot of punch-through voltage values versus n-well to n-well spacing of the device structure as shown in FIG. 2.

The n-well to n-well spacing is properly chosen based on the curve shown in FIG. 4. Proper selection will allow enough voltage for turn-on of the ESD protection device 10 during an ESD event at the output pad and a high enough punch-through level such that the device 10 remains off during normal operations. In the preferred embodiment, it was found that an n-well to n-well spacing of seven (7) microns exhibits a punch-through turn-on of approximately 11-12 volts during an ESD event. In general, the lower the punch-through turn-on, the better the ESD protection.

As will also be noted from FIG. 4, performance of the ESD protection device 10 can be optimized by the use of back biasing the chip. With back biasing, the chip in which the device 10 is employed can be operated at a higher power supply voltage. This provides the advantage of making device 10 usable with a variety of integrated circuit applications. For the same physically dimensioned device 10, the use of back biasing can be seen (in FIG. 4) to effectively double the required punch-through turn-on voltage during normal operations. This insures that the device 100 will not affect the normal system operation of the chip in which it is employed. Yet, during handling, when no biasing has been established, the punch-through level is much lower than the breakdown voltages generally associated with buffer transistors Q1, Q2.

In an alternative embodiment, optimization can be achieved through alterations in the oxide thickness and by creating a doped field implant region in the channel region 20 near the oxide 26. In the test data shown in FIG. 4, a field implant region doped to a concentration of approximately $1.5 \times 10^{13}$ with boron ions below the field oxide 26 is considered.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies, such as with other MOS or even bipolar processes. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. An electrostatic protection device for a semiconductor substrate integrated circuit having at least two reference potential levels, an output pad, a first n-channel transistor having a drain terminal coupled to the more positive of said reference potential levels, a source terminal coupled to said output pad, and a gate terminal coupled to an output of said circuit, and a second n-channel transistor having a drain terminal coupled to said output pad, a source terminal coupled to the more negative of said reference potential levels, and a gate terminal coupled to an output of said circuit, characterized by:
   at least one n-channel transistor having a drain terminal coupled to said output pad, a source terminal coupled to said more negative of said reference potential levels, and a gate coupled to said output pad, the at least one transistor having a punch-through voltage higher than the highest voltage reached by said output pad during normal operation of said circuit and lower than the failure voltage of both the first and second transistors.

2. The device as set forth in claim 1, further comprising:
   a plurality of n-well contact regions, subjacent each drain contact of said n-channel transistors to said pad.

3. The device as set forth in claim 2, further comprising:
   n+ doped regions in said n-well contact regions.

4. The device as set forth in claim 1, wherein the channel region of said at least one transistor comprises:
   a region doped with carriers of the same conductivity type as said substrate is doped, having a higher doping concentration than said substrate.

5. An ESD protection semiconductor device for a an integrated circuit having a reference potential Vss and an output pad connected to an output of the circuit, comprising:
   an n-well, n-channel FET having a source, a drain and a channel region and having a semiconductor gate isolated from the channel region by a relatively thick field dielectric layer, said gate and said drain coupled to said output pad and said source coupled to said Vss, such that said FET turns on at a voltage which forces said FET into a punch-through mode during an ESD occurrence into said pad,
   said integrated circuit also having a back bias voltage, wherein said punch-through mode occurs at approximately twice the voltage of a circuit not having said back bias.

6. An electrostatic discharge (ESD) protection device for an output of an integrated circuit, the integrated circuit having an output buffer connected to a connection pad, the device comprising an ESD field effect transistor having its drain and gate terminals connected to the connection pad and having its source terminal connected to a source circuit potential, the ESD transistor having dimensions and doping levels such that it turns on when an electrostatic discharge voltage on the connection pad reaches a first voltage level, the first voltage level being less in magnitude than the failure voltage of the output buffer, turn-on of the ESD transistor being in the punch-through mode.

7. A device according to claim 6, wherein the dimensions and doping levels of the ESD transistor are such that the first voltage level is higher than the highest voltage reached by the connection pad during normal operation of the integrated circuit.

8. A device according to claim 6, wherein the source circuit potential is at substantially a Vss level when the integrated circuit is not operating and a Vbb level below the Vss level when the integrated circuit is operating.

9. A device according to claim 8, wherein the dimensions and doping levels of the ESD transistor are such that the first voltage level when the source circuit potential is at the Vbb level is higher than the highest voltage reached by the connection pad during normal operation of the integrated circuit, and such that the first voltage level when the source circuit potential is at the Vss level is lower than the highest voltage reached by the connection pad during normal operation of the integrated circuit.

10. A device according to claim 9, wherein the output buffer comprises first and second transistors, the first transistor having a drain terminal coupled to a Vcc level, having a source terminal connected to the connection pad and having a gate terminal, the second transistor having a drain terminal coupled to the connection pad, having a source terminal coupled to the Vss level and having a gate terminal, wherein the dimensions and doping levels of the ESD transistor are such that the first voltage level when the source circuit potential is at either the Vbb level or the Vss level is much lower than the gated diode voltage or junction breakdown voltage of either the first or second transistor.

11. A device according to claim 6, wherein the ESD transistor comprises:
 a substrate having a first conductivity type;
 a drain well region in the substrate, the drain well region having a conductivity of a second type;
 a source well region in the substrate, the source well region having a conductivity of the second type;
 a channel region in the substrate, separating the drain well region and the source well region; and
 an insulator layer superposing the substrate, the gate terminal superposing the insulator layer over the channel region,
 the ESD transistor further comprising:
 a drain terminal region in the drain well region, the drain terminal region having a conductivity of the second type and having a higher dopant concentration than the drain well region, the drain terminal being coupled to the drain terminal region; and
 a source terminal region in the source well region, the source terminal region having a conductivity of the second type and having a higher dopant concentration than the source well region, the source terminal being coupled to the source terminal region.

12. An electrostatic discharge protection device for an output of an integrated circuit, the integrated circuit having an output buffer comprising first and second transistors, the first transistor having a gate terminal, a drain terminal coupled to a Vcc reference potential level and a source terminal coupled to an output pad, the second transistor having a gate terminal, a drain terminal coupled to the output pad and a source terminal coupled to a Vss reference potential level, the device comprising an ESD field effect transistor having its drain and gate terminals connected to the output pad and having its source terminal connected to a source circuit potential, the ESD transistor having dimensions and doping levels such that it turns on when an electrostatic discharge voltage on the output pad reaches a first voltage level, the first voltage level being much less than the gated diode breakdown voltage and the junction breakdown voltage of both the first and second transistors, but greater than the highest voltage reached by the output pad during normal operation of the integrated circuit, turn-on of the ESD transistor being in the punch-through mode, wherein the ESD transistor comprises:
 a p-type substrate;
 an n-type drain well region in the substrate;
 an n-type source well region in the substrate;
 a channel region in the substrate, separating the drain well region and the source well region;
 an insulator layer superposing the substrate, the gate terminal superposing the insulator layer over the channel region;
 a drain terminal region in the drain well region, the drain terminal region being doped $n^+$, the drain terminal being coupled to the drain terminal region; and
 a source terminal region in the source well region, the source terminal region being doped $n^+$, the source terminal being coupled to the source terminal region.

* * * * *